(12) United States Patent
Ide

(10) Patent No.: US 6,241,822 B1
(45) Date of Patent: Jun. 5, 2001

(54) VERTICAL HEAT TREATMENT APPARATUS

(75) Inventor: Shigeaki Ide, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/487,390

(22) Filed: Jan. 18, 2000

(30) Foreign Application Priority Data

Jan. 19, 1999 (JP) ................................................. 11-010666

(51) Int. Cl.[7] .................................................. C23C 16/00
(52) U.S. Cl. ........................ 118/666; 118/715; 118/724; 118/725; 118/712; 118/713
(58) Field of Search .................... 118/724, 725, 118/715, 688, 666, 712, 713; 432/241

(56) References Cited

U.S. PATENT DOCUMENTS

| | | | |
|---|---|---|---|
| 4,149,923 | * | 4/1979 | Uehara et al. ........................ 156/345 |
| 4,573,431 | * | 3/1986 | Sarkozy ................................ 118/725 |
| 4,756,272 | * | 7/1988 | Kesseler et al. ...................... 118/715 |
| 5,029,554 | * | 7/1991 | Miyashita et al. .................... 118/715 |
| 5,234,501 | * | 8/1993 | Nakao et al. ......................... 118/719 |
| 5,603,772 | * | 2/1997 | Ide ........................................ 118/724 |
| 5,702,531 | * | 12/1997 | Mikata ................................... 118/697 |
| 5,750,436 | * | 5/1998 | Yamaga et al. ....................... 438/558 |
| 5,800,616 | * | 9/1998 | Persyn .................................... 118/719 |
| 6,030,457 | * | 2/2000 | Shimazu et al. ...................... 118/715 |

FOREIGN PATENT DOCUMENTS

| | | | |
|---|---|---|---|
| 2-303024 | 12/1990 | (JP) | ............................... H01L/21/22 |
| 3-82017 | 4/1991 | (JP) | ............................. H01L/21/205 |
| 2634595 | 4/1997 | (JP) | ................................ H01L/21/31 |

* cited by examiner

Primary Examiner—Jeffrie R. Lund
(74) Attorney, Agent, or Firm—Hayes, Soloway, Hennessey, Grossman & Hage, P.C.

(57) ABSTRACT

A vertical heat treatment apparatus for forming oxide films on a plurality of semiconductor wafers. The apparatus comprises: a reaction tube which inclines from the vertical direction toward the horizontal direction by a predetermined angle; and a wafer supporting means which supports a plurality of semiconductor wafers inside the reaction tube such that the wafers are disposed parallel to each other while keeping a gap between adjacent upper and lower wafers and having an offset portion between adjacent upper and lower wafers. The plurality of semiconductor wafers disposed inside said reaction tube are heated and a predetermined gas is introduced into the reaction tube, thereby oxide films are formed on the plurality of semiconductor wafers.

12 Claims, 8 Drawing Sheets

PRIOR ART

PRIOR ART

VERTICAL HEAT TREATMENT APPARATUS

FIELD OF THE INVENTION

The present invention relates generally to a vertical heat treatment apparatus for forming an oxide film on a surface of each semiconductor wafer of a batch of the semiconductor wafers, and, more particularly, to such vertical heat treatment apparatus in which thickness of the oxide films formed on the plurality of semiconductor wafers can be precisely detected.

BACKGROUND OF THE INVENTION

Conventionally, as a heat treatment apparatus used in a manufacturing process of a semiconductor device, a lateral or horizontal heat treatment apparatus is used in which a reaction tube and a heater are laterally disposed. However, recently, a vertical heat treatment apparatus are increasingly used in which the reaction tube and the heater are vertically disposed. This is because, in the vertical heat treatment apparatus, possibility of incorporation of external air into the reaction tube is reduced, uniformity of thickness and homogeneity of films formed are superior to those of the lateral type heat treatment apparatus, and the like. The heat treatment apparatus is used for forming a field oxide film for element isolation, a gate oxide film and the like of a semiconductor device, and, according to recent miniaturization and increase in an integration degree of a semiconductor device, more strict control of a thickness of an oxide film formed is required.

FIG. 6 illustrates a schematic cross section of a vertical heat treatment apparatus as a first prior art example.

The vertical heat treatment apparatus of FIG. 6 comprises a reaction tube 102, a gas supply tube 103 for introducing a predetermined gas into the reaction tube 102, a heater 104 for heating inside of the reaction tube 102, and a quartz boat 105 for loading semiconductor wafers 101. Approximately 50 through 100 sheets of semiconductor wafers 101 are loaded on the quartz boat 105 as one set (hereafter referred to as a "batch").

Next, an explanation will be made on a method of forming an oxide film on each of the semiconductor wafers by using the prior art vertical heat treatment apparatus mentioned above.

First, into the reaction tube 102 heated to a high temperature of 800 degrees Celsius through 1000 degrees Celsius by the heater 104, the quartz boat 105 on which a batch of semiconductor wafers 101 are loaded is inserted. Then, a predetermined gas such as oxygen, steam, water vapor and the like is introduced into the heated reaction tube 102 from the gas supply tube 103 at a predetermined flow rate. Thereby, chemical reaction occurs at the surface of each of the semiconductor wafers 101 with the introduced gas, and a desired oxide film is formed on the surface of each of the semiconductor wafers 101. In this case, it is necessary to confirm that each of the oxide films formed on the surface of the semiconductor wafers 101 has a desired film thickness. For this purpose, the quartz boat 105 on which the semiconductor wafers 101 are loaded is taken out from the reaction tube 102, and the thickness of the oxide film formed on each of the semiconductor wafers 101 is measured by using a film thickness measurement apparatus not shown in the drawing.

In order to fabricate an oxide film having a predetermined film thickness on each of the semiconductor wafers 101 by using the prior art vertical heat treatment apparatus, it is necessary to perform condition determining operations in which relations of a rate of forming an oxide film on a semiconductor wafer and a formed film thickness, with respect to a heat treatment temperature of the semiconductor wafer, a heat treatment time of the semiconductor wafer and a flow rate of various gases introduced into the reaction tube 102 are previously clarified. However, in the conventional vertical heat treatment apparatus, a flow rate of a reaction gas introduced into the reaction tube 102 and a temperature inside the reaction tube 102 vary delicately depending on an individual difference of an apparatus, variation of environment of the apparatus and the like. Thus, it becomes difficult to form an oxide film having a desired film thickness on a semiconductor wafer 101, by using the conditions such as the heat treatment time and the like determined based on the above-mentioned condition determining operations. As a result, it was difficult to stably and uniformly form oxide films each having a desired film thickness on a batch of semiconductor wafers.

If, as a result of the above-mentioned measurement of film thickness, there are semiconductor wafers having oxide films whose thickness is smaller than a predetermined film thickness, heat treatment is again performed for such semiconductor wafers until the oxide films each having a predetermined film thickness are fabricated. In case the heat treatment is performed again, process steps increase by such additional heat treatment, so that time loss and cost in the manufacturing process increase.

On the other hand, if there are semiconductor wafers having oxide films whose thickness is out of specification, for example, whose film thickness is too thick, such semiconductor wafers are discarded. In such case, there occur an increase in manufacturing cost and deterioration of manufacturing yield of a semiconductor device.

In order to solve the above-mentioned problems, there is proposed a lateral reduced pressure vapor phase growth system in Japanese patent laid-open publication No. 3-82017. In this system, a thickness of a film formed on each of semiconductor wafers disposed in a reaction tube is measured regularly, and, by using the result of the measurement, a heating temperature within the reaction tube and a flow rate of gas introduced into the reaction tube are feedback-controlled, thereby a film having a desired film thickness is formed on each of the semiconductor wafers.

An explanation will be made on the lateral reduced pressure vapor phase growth system disclosed in the above-cited Japanese publication as a second prior art apparatus.

FIG. 7 is a block diagram illustrating a structure of the lateral reduced pressure vapor phase growth apparatus including various control system, as the second prior art apparatus.

The prior art apparatus shown in FIG. 7 comprises a reaction tube 201, halogen lamps 202 for heating inside of the reaction tube 201, and a quartz boat 203 for loading semiconductor wafers 204. The reaction tube 201 comprises a gas inlet 205 and a gas outlet 206. The prior art apparatus of FIG. 7 also comprises a laser light emitting potion 216 which is composed of a laser source 207, a polarizer 208 and a compensator 209, and a laser light detecting portion 217 which is composed of an analyzer 210 and a photo-detector 211. The laser light emitting portion 216 and the laser light detecting portion 217 are disposed outside the reaction tube 201 as a pair, and compose an ellipsometer. The prior art apparatus of FIG. 7 further comprises, as a portion constituting a control system, a data processing portion 212 for processing an output signal from the photo-detector 211, a central processing portion 213, a temperature control portion 214 for controlling a heating temperature by the halogen lamps 202, and a gas flow rate control portion 215 for controlling a flow rate of a gas introduced into the reaction tube 201 from the gas inlet 205.

Next, an explanation will be made on a method of forming a film by using the lateral reduced pressure vapor phase growth apparatus shown in FIG. 7. First, the reaction tube 201 is previously heated to a high temperature of 100through 1000 degrees Celsius by the halogen lamps 202. Then, a batch of 50 through 100 sheets of semiconductor wafers 204 are loaded on the quartz boat 203 such that each of these semiconductor wafers 204 is stood vertically thereon. The quartz boat 203 thus loaded with the semiconductor wafers 204 is inserted into the reaction tube 201.

The reaction tube 201 is vacuated from the gas outlet 206 to a pressure of approximately 0.003 Torr by using a mechanical booster pump and a rotary pump not shown in the drawing. Thereafter, a reactant gas is introduced into the reaction tube 201 from the gas inlet 205. The reactant gas pyrolyzes or chamically react with other gas or gases introduced into the reaction tube 201. As a result, a desired film is deposited on each of the semiconductor wafers 204.

At this time, a laser light polarized elliptically is irradiated onto the surface of a semiconductor wafer 204 from the laser light emitting portion 216. The laser light irradiated onto the surface of the semiconductor wafer 204 is reflected, and the reflected laser light is detected at the laser light detecting portion 217.

The reflected laser light detected at the laser light detecting portion 217 is converted into an electric signal which is inputted to the data processing portion 212. The data processing portion 212 calculates a phase, an amplitude and the like of the reflected laser light. Also, the data processing portion 212 compares phases, amplitudes and the like of the laser light irradiated onto the surface of the semiconductor wafer 204 and the reflected laser light with each other, and calculates a refractive index and a thickness of the film deposited on the semiconductor wafer 204. The calculated data of the refractive index and the thickness of the film is transmitted to the central processing portion 213.

Based on the data transmitted from the data processing portion 212, the central control portion 213 adjusts a temperature inside the reaction tube 201 by controlling the temperature controlling portion 214 which uses a silicon controlled rectifier and adjusts a flow rate of the reactant gas introduced into the reaction tube 201 from the gas inlet 205 by controlling the gas flow rate controlling portion 205 which uses an air flow controller such that a refractive index, a deposition rate, a film thickness and the like of a film deposited on the semiconductor wafer 204 become respective predetermined values.

Next, a third prior art example will be described with reference to the drawings. FIG. 8A illustrates, as the third prior art example, a schematic cross section of a structure of another lateral reduced pressure vapor phase growth apparatus which is also described in the above cited Japanese patent laid-open publication No. 3-82017. FIG. 8B illustrates a partial enlarged view of a portion A of the apparatus of FIG. 8A.

Differing from the lateral reduced pressure vapor phase growth apparatus of FIG. 7, the prior art lateral reduced pressure vapor phase growth apparatus shown in FIG. 8A is constituted such that semiconductor wafers 204 are disposed horizontally within a reaction tube 201 and, in this condition, a desired film is formed on each of the semiconductor wafers 204. However, a fundamental structure of the apparatus of FIG. 8A is the same as that of the apparatus of FIG. 7, and components similar to those of FIG. 7 are designated by the same reference numbers and explanation thereof is omitted here. Also, in FIG. 8A, illustration of a control system is omitted. The lateral reduced pressure vapor phase growth apparatus of FIG. 8A is used when lack of silane gas as reactant gas is compensated by making a temperature of the most rear portion of the reaction tube 201 higher than that of the most front portion and the middle portion of the reaction tube 201 by 5 through 15 degrees Celsius to increase a deposition rate, like a polysilicon CVD apparatus. By using such constitution, it is possible to suppress variation of film quality and film thickness of a deposited film depending on a location within the reaction tube 201 and variation of film quality and film thickness of a deposited film depending on a portion on the surface within a semiconductor wafer 204, although the number of semiconductor wafers processed at a time is small.

Also, as shown in FIG. 8B, in this apparatus, SiC coated metal plates 218 are disposed over and under the semiconductor wafers 204 to increase uniformity of a temperature distribution within the reaction tube 201. Further, copper blocks 219 which are water-cooled are disposed on the reaction tube 201 to avoid deposition of a film on portions of the reaction tube 201 where a laser light irradiated onto the surface of the semiconductor wafers 204 for measuring a film thickness of a film formed on the semiconductor wafer 204 passes.

The heat treatment apparatus proposed in the above-described Japanese patent laid-open publication No. 3-82017 is an example of a lateral type reduced pressure vapor phase growth apparatus. Also, in this apparatus, the thickness of a film deposited on the surface of one semiconductor wafer which is loaded on the most outside, i.e., the most left side of the quartz boat 203 of FIG. 7, among a plurality of semiconductor wafers inserted into the reaction tube 201 is measured, and the film thickness data obtained by this measurement is used as a feedback data to control the thickness of the films formed on all of the batch of the semiconductor wafers. That is, in this apparatus, the thickness of the films formed on the semiconductor wafers of one batch, for example, 100 sheets of semiconductor wafers, is controlled based on the thickness of the film formed on one semiconductor wafer. The thickness of the films formed on the semiconductor wafers disposed at the middle portion and at the right side portion of the quartz boat 203 of FIG. 7 is not considered at all. This is because, since a plurality of semiconductor wafers are vertically loaded on the quartz boat 203, the gap between adjacent wafers becomes narrow. Therefore, it is impossible to irradiate a laser light onto and to receive a reflected laser light from the surface of any semiconductor wafer other than the semiconductor wafer disposed on the most left portion of the quartz boat 203.

As mentioned before, a temperature within the reaction tube is not constant because of the surrounding atmosphere and the like. Also, a flow rate of a gas introduced into the reaction tube varies due to the individual variation of the apparatus. Therefore, thickness of a film deposited on the surface of a semiconductor wafer varies depending on the location within the reaction tube. Thus, if, for example, the film thickness of the films formed on the semiconductor wafers loaded on the left side, the middle portion and the right side of the quartz boat of FIG. 7 is measured and the thickness of the films formed on a batch of semiconductor wafers can be controlled based on the data obtained from a plurality of semiconductor wafers, it is possible to more precisely control the thickness of the films formed on a batch of semiconductor wafers. However, in the above-described conventional lateral type reduced pressure vapor phase growth apparatus, it was impossible to measure the thickness of films formed on a plurality of semiconductor wafers, and it was impossible to improve uniformity of thickness of films formed on semiconductor wafers.

SUMMARY OF THE INVENTION

Considering the above-mentioned disadvantages of the conventional apparatus, the present invention aims at providing a vertical heat treatment apparatus in which films each having a desired thickness can be precisely formed on semiconductor wafers.

It is another object of the present invention to provide a vertical heat treatment apparatus capable of batch processing in which films each having a desired thickness can be precisely formed on semiconductor wafers.

It is still another object of the present invention to provide a vertical heat treatment apparatus in which thickness of films formed on a batch of semiconductor wafers can be strictly controlled.

It is still another object of the present invention to provide a vertical heat treatment apparatus in which uniformity of thickness of films formed on a batch of semiconductor wafers can be improved.

It is still another object of the present invention to provide a vertical heat treatment apparatus in which increase in manufacturing cost and loss of manufacturing time can be effectively suppressed.

It is still another object of the present invention to provide a vertical heat treatment apparatus in which manufacturing yield of a semiconductor device can be improved.

According to an aspect of the present invention, there is provided a vertical heat treatment apparatus comprising: a reaction tube which inclines from the vertical direction toward the horizontal direction by a predetermined angle; and a wafer supporting means which supports a plurality of semiconductor wafers inside the reaction tube such that the wafers are disposed parallel to each other while keeping a gap between adjacent upper and lower wafers and having an offset portion between adjacent upper and lower wafers; wherein the plurality of semiconductor wafers disposed inside the reaction tube are heated and a predetermined gas is introduced into the reaction tube, thereby forming oxide films on the plurality of semiconductor wafers.

In this case, it is preferable that the vertical heat treatment apparatus further comprises a plurality of film thickness detecting means, each of the plurality of film thickness detecting means detects the thickness of the oxide film formed on the offset portion of mutually different one of the plurality of semiconductor wafers disposed in the reaction tube.

Also, it is preferable that the vertical heat treatment apparatus further comprises: at least one heating means for heating the plurality of semiconductor wafers disposed inside the reaction tube; and a control means which controls heating temperature of the at least one heating means and a flow rate of the predetermined gas introduced into the reaction tube.

It is advantageous that each of the plurality of film thickness detecting means comprises a first optical fiber and a second optical fiber, the first optical fiber irradiates a laser light onto the offset portion of the semiconductor wafer to detect thickness of an oxide film formed on the semiconductor wafer, and the second optical fiber receives a laser light irradiated from the first optical fiber and reflected by the offset portion of the semiconductor wafer.

It is also advantageous that the reaction tube inclines from the vertical direction toward the horizontal direction by an angle of 30 through 70 degrees.

It is preferable that the offset portion of each of the semiconductor wafers has a width of approximately 3 through 15 mm.

It is also preferable that the supporting means is made of quartz.

It is further preferable that at least a part of each of the plurality of film thickness detecting means is disposed at the supporting means.

It is still further preferable that a plurality of the heating means are provided.

It is advantageous that the number of the heating means corresponds to the number of the film thickness detecting means.

It is also advantageous that each of the heating means is disposed at a location corresponding to a location of each of the plurality of film thickness detecting means.

It is further advantageous that the control means controls the heating temperature of each of the heating means independently, based on the thickness of the oxide film detected by a corresponding one of the plurality of film thickness detecting means.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF THE PREFERRED EMBODIMENT

With reference to the drawings, an embodiment of the present invention will now be described in detail.

Figure 1:
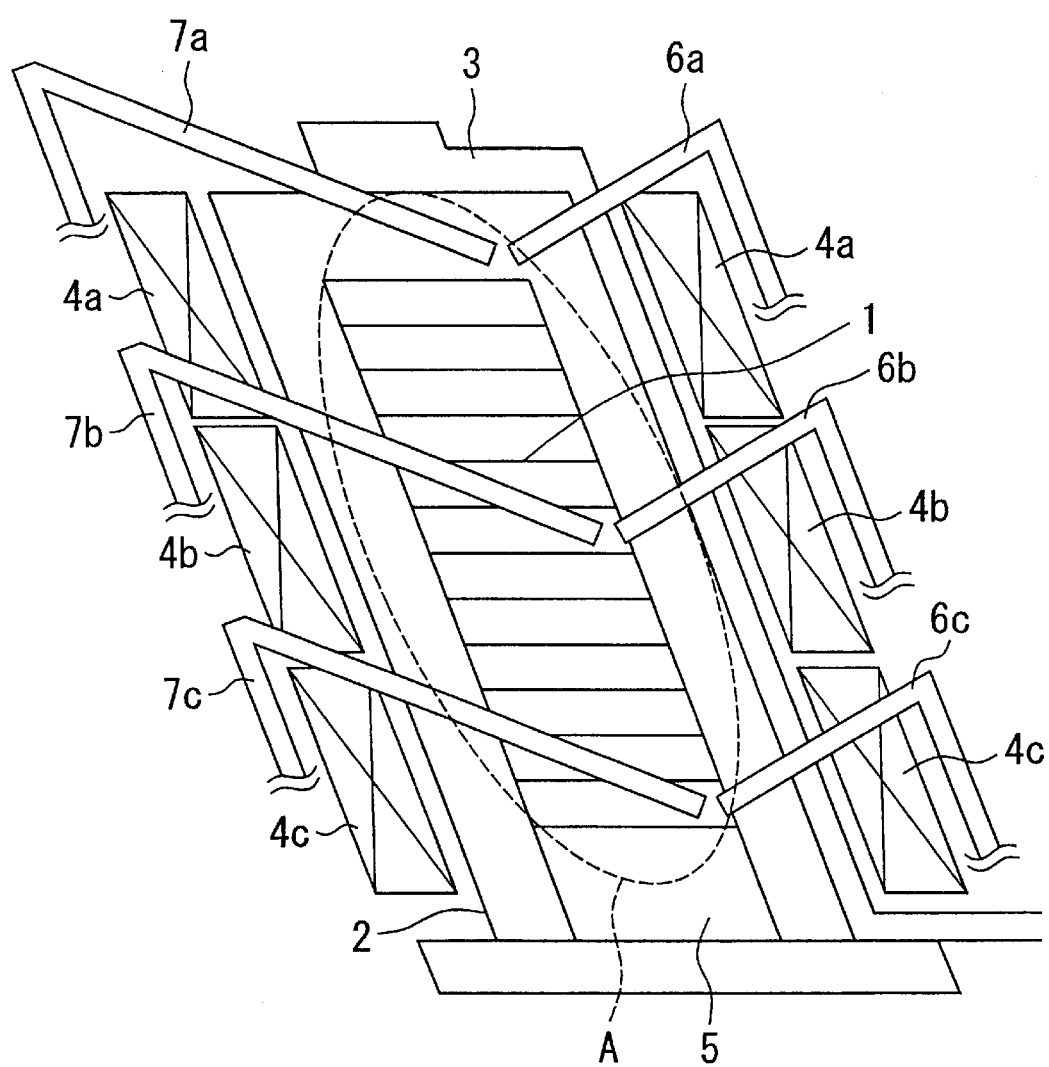
FIG. 1 is a cross sectional view illustrating a schematic structure of a vertical heat treatment apparatus according to an embodiment of the present invention.
Figure 2:
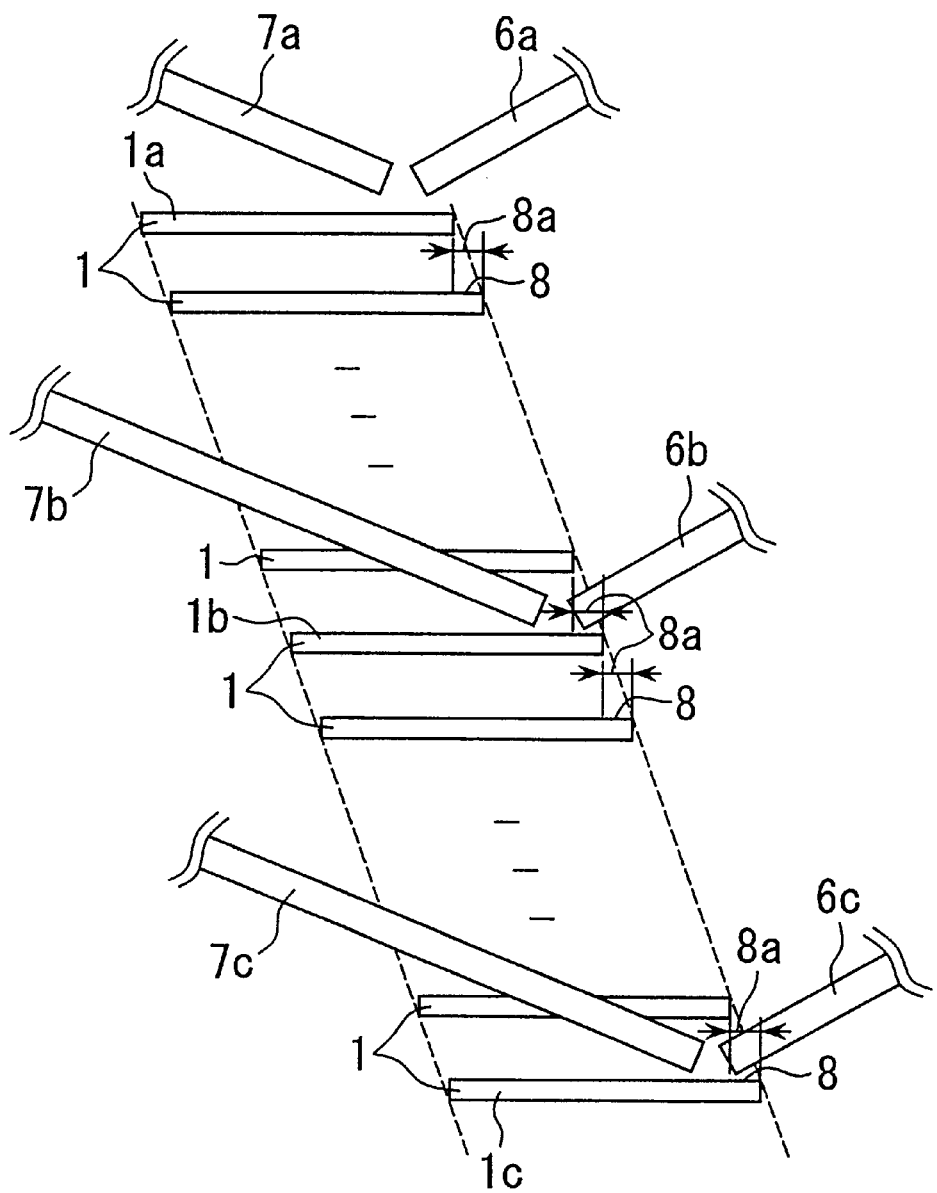
FIG. 2 is an enlarged cross sectional view illustrating in detail a portion A of the vertical heat treatment apparatus shown in FIG. 1.
Figure 3:
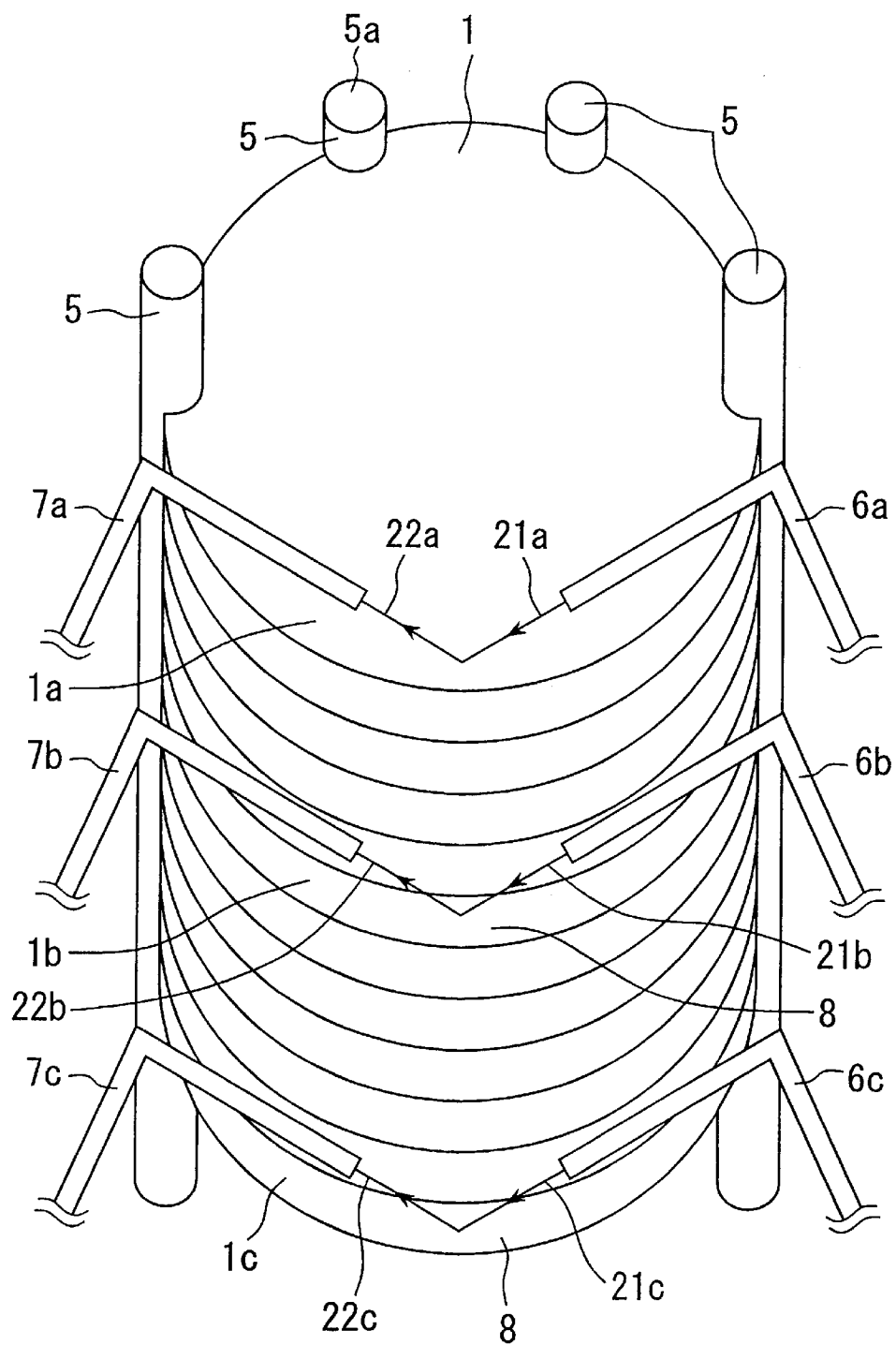
FIG. 3 is a schematic perspective view illustrating a portion A of the vertical heat treatment apparatus shown in FIG. 1 as seen from an upper side portion of the apparatus.

FIG. 1 illustrates a schematic cross sectional structure of a vertical heat treatment apparatus according to an embodiment of the present invention. FIG. 2 illustrates in detail a portion A of the vertical heat treatment apparatus shown in FIG. 1. FIG. 3 schematically illustrates a portion A of the vertical heat treatment apparatus shown in FIG. 1 as seen from an upper side portion of the apparatus.

As shown in FIG. 1, the vertical heat treatment apparatus according to the present embodiment comprises a reaction tube 2 made of quartz and the like, a gas supply tube 3, and heaters 4a through 4c for heating inside of the reaction tube 2 to a desired temperature. Although not shown in the drawings, there are provided a number of small holes for introducing a desired gas such as oxygen, steam, water vapor and the like into the reaction tube 2 from the gas supply tube 3. Also, although not shown in the drawings, there is provided an exhaust pipe or escape pipe for exhausting inner gas within the reaction tube 2 at, for example, the bottom portion of the reaction tube 2. The heaters 4a through 4c are, for example, resistive heaters, and can heat the upper portion, the middle portion and the lower portion within the reaction tube 2, respectively. Heating temperatures of these heaters 4a through 4c can be independently controlled.

In the reaction tube 2, there is disposed a quartz boat 5 onto which a plurality of semiconductor wafers 1, for example, 100 through 200 sheets of semiconductor wafers 1, can be loaded. The semiconductor wafers 1 are loaded onto the quartz boat 5 such that a gap is formed between adjacent upper and lower wafers. The vertical heat treatment apparatus according to this embodiment further comprises optical fibers 6a through 6c for irradiating laser light or beams onto the surfaces of the semiconductor wafers 1, and optical fibers 7a through 7c for receiving laser light reflected from the surfaces of the semiconductor wafer 1. The optical fibers 6a through 6c for irradiating laser light and the optical fibers 7a through 7c for receiving laser light penetrate through holes provided in the side wall portions of the reaction tube 2, and no gap exists between each of the optical fibers and the corresponding hole in the side wall portion of the reaction tube 2. Although not shown in the drawings, end portions of the optical fibers 6a through 6c outside the reaction tube 2 are coupled to respective laser light sources and the like, and end portions of the optical fibers 7a through 7c outside the reaction tube 2 are coupled to detection units 13a through 13c, respectively (described later).

Figure 4:
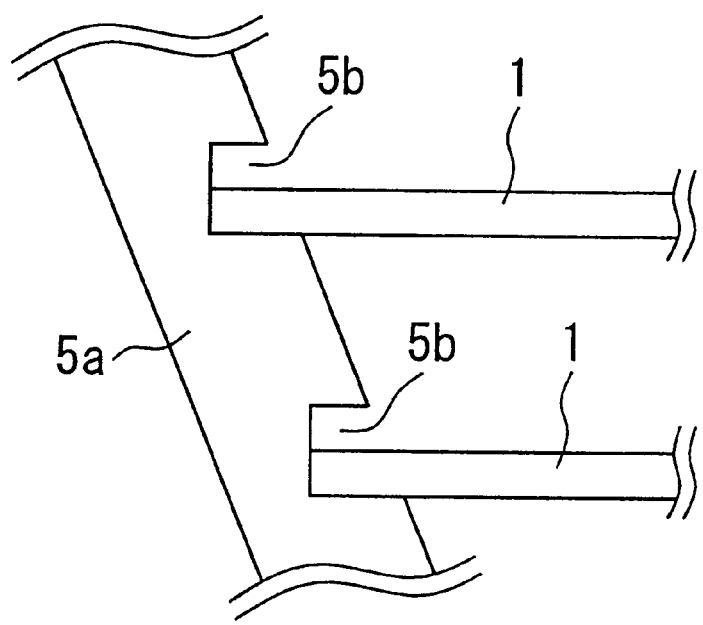
FIG. 4 is a cross sectional view showing a structure of a part of a quartz boat for loading wafers used in the vertical heat treatment apparatus shown in FIG. 1.

In order to load many semiconductor wafers onto a quartz boat while maintaining a predetermined gap between adjacent upper and lower wafers, any appropriate means can be used. For example, as shown in FIG. 4, the quartz boat 5 comprises four quartz poles 5a, and each pole 5a has many parallel grooves 5b formed so as to keep a predetermined space between adjacent grooves. Each of the semiconductor wafers 1 is inserted into the grooves Sb of four poles 5a.

In this embodiment, the reaction tube 2 leans from the vertical line by a predetermined angle, and the quartz boat 5 inserted into the reaction tube 2 also leans similarly. Each of the semiconductor wafers 1 is loaded horizontally onto the quartz boat 5 while keeping a predetermined distance between adjacent upper and lower wafers. Therefore, when the semiconductor wafers 1 loaded onto the quartz boat 5 and inserted into the reaction tube 2 are observed from a portion right above them, each of the semiconductor wafers 1 has an offset portion or shifted portion 8 at the end portion thereof where adjacent wafers do not overlap.

The optical fiber 6a for irradiating laser light is disposed such that the laser light emitted therefrom is irradiated onto the offset portion 8 of the surface of the semiconductor wafer 1a loaded onto the upper portion of the quartz boat 5. The optical fiber 7a for receiving laser light is disposed so as to constitute a pair with the optical fiber 6a and so as to receive a laser light which is irradiated from the optical fiber 6a and reflected by the offset portion 8 of the surface of the semiconductor wafer 1a. Similarly, the optical fiber 6b for irradiating laser light is disposed such that the laser light emitted therefrom is irradiated onto the offset portion 8 of the surface of the semiconductor wafer 1b loaded onto the middle portion of the quartz boat 5. The optical fiber 7b for receiving laser light is disposed so as to constitute a pair with the optical fiber 6b and so as to receive a laser light which is irradiated from the optical fiber 6b and reflected by the offset portion 8 of the surface of the semiconductor wafer 1b. Further, the optical fiber 6c for irradiating laser light is disposed such that the laser light emitted therefrom is irradiated onto the offset portion 8 of the surface of the semiconductor wafer 1c loaded onto the lower portion of the quartz boat 5. The optical fiber 7c for receiving laser light is disposed so as to constitute a pair with the optical fiber 6c and so as to receive a laser light which is irradiated from the optical fiber 6c and reflected by the offset portion 8 of the surface of the semiconductor wafer 1c.

It should be noted that, in practice, the optical fibers 6a through 6c and the optical fibers 7a through 7c extend perpendicular to the drawing sheets of FIG. 1 and FIG. 2. However, in these drawings, the optical fibers 6a through 6c and the optical fibers 7a through 7c are illustrated to extend in directions different from the actual directions for the sake of easy illustration and understanding. Actual directions of the optical fibers 6a through 6c and the optical fibers 7a through 7c are illustrated more accurately in FIG. 3.

The vertical heat treatment apparatus according to this embodiment is characterized in that the reaction tube 2 and the quartz boat 5 lean or incline as shown in FIG. 1. Preferably, the reaction tube 2 and the quartz boat 5 incline from the vertical direction toward the horizontal direction by approximately 30 through 70 degrees. Since the reaction tube 2 leans from the vertical direction toward the horizontal direction by approximately 30 through 70 degrees, the semiconductor wafers 1 loaded onto the quartz boat 5 inserted into the reaction tube 2 are mutually shifted in the horizontal direction. Therefore, at each end portion of the upper surfaces of the semiconductor wafers 1, a shifted portion or an offset portion 8 is produced which is a non-overlapped portion between adjacent upper and lower wafers and which has a width 8b of approximately 3 through 15 mm. In this case, the upper surface of each of the semiconductor wafers 1 is the surface on which an oxide film is to be formed.

Since the reaction tube 2 and the quartz boat 5 are inclined and a plurality of semiconductor wafers 1 are disposed such that they are mutually shifted in a horizontal direction, it is possible to irradiate laser light or beam from each of the optical fibers 6a through 6c onto the shifted portion of any one of the semiconductor wafers 1, and to receive laser light or beam reflected from the shifted portion by each of the optical fibers 7a through 7c. Thereby, it becomes possible to easily and surely detect the thickness of oxide films formed on the shifted portions, that is, on the upper surfaces, of any three semiconductor wafers among a plurality of semiconductor wafers 1.

Figure 5:
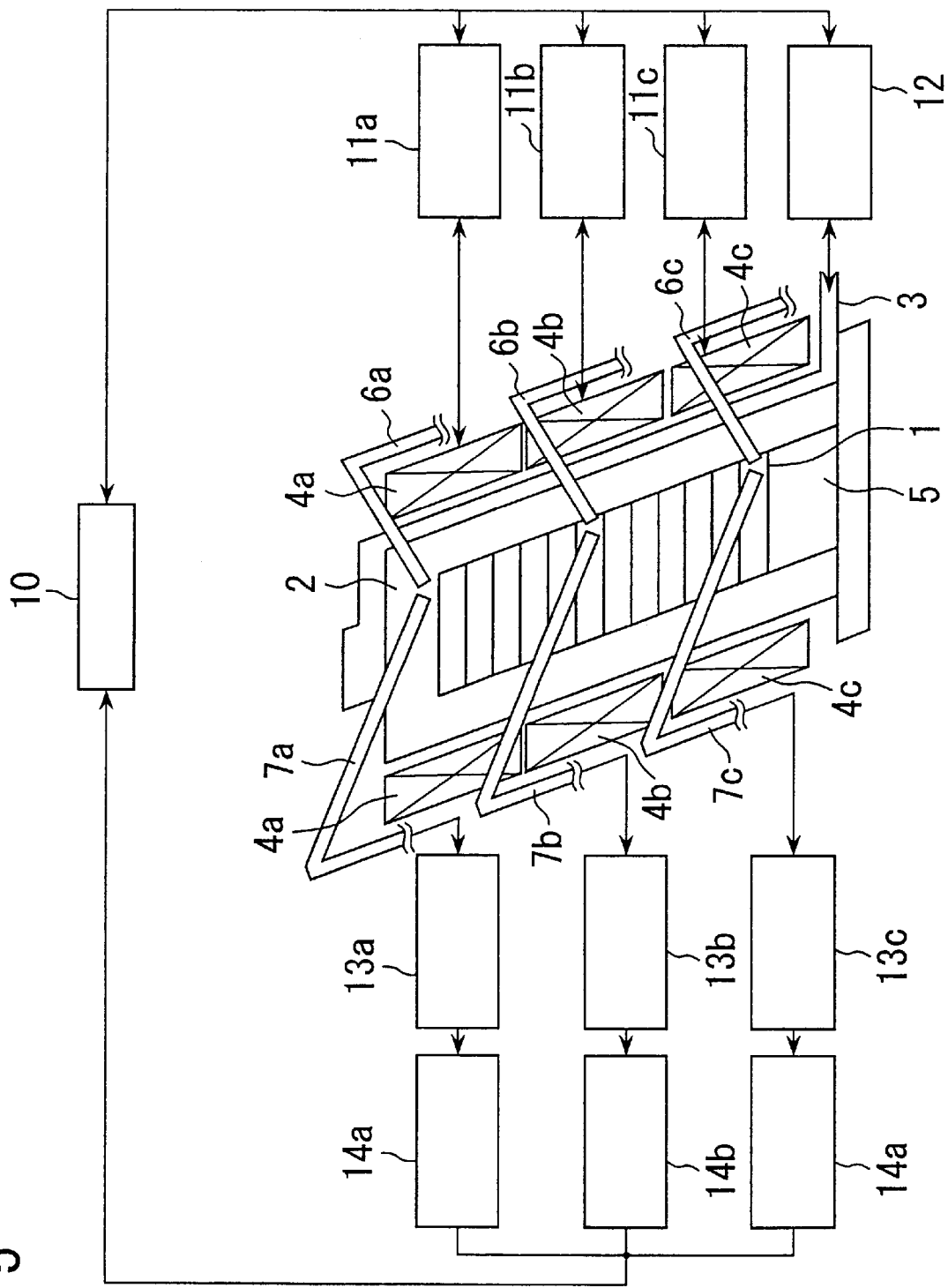
FIG. 5 is a block diagram showing an overall structure of the vertical heat treatment apparatus including a control portion according to an embodiment of the present invention.
Figure 6:
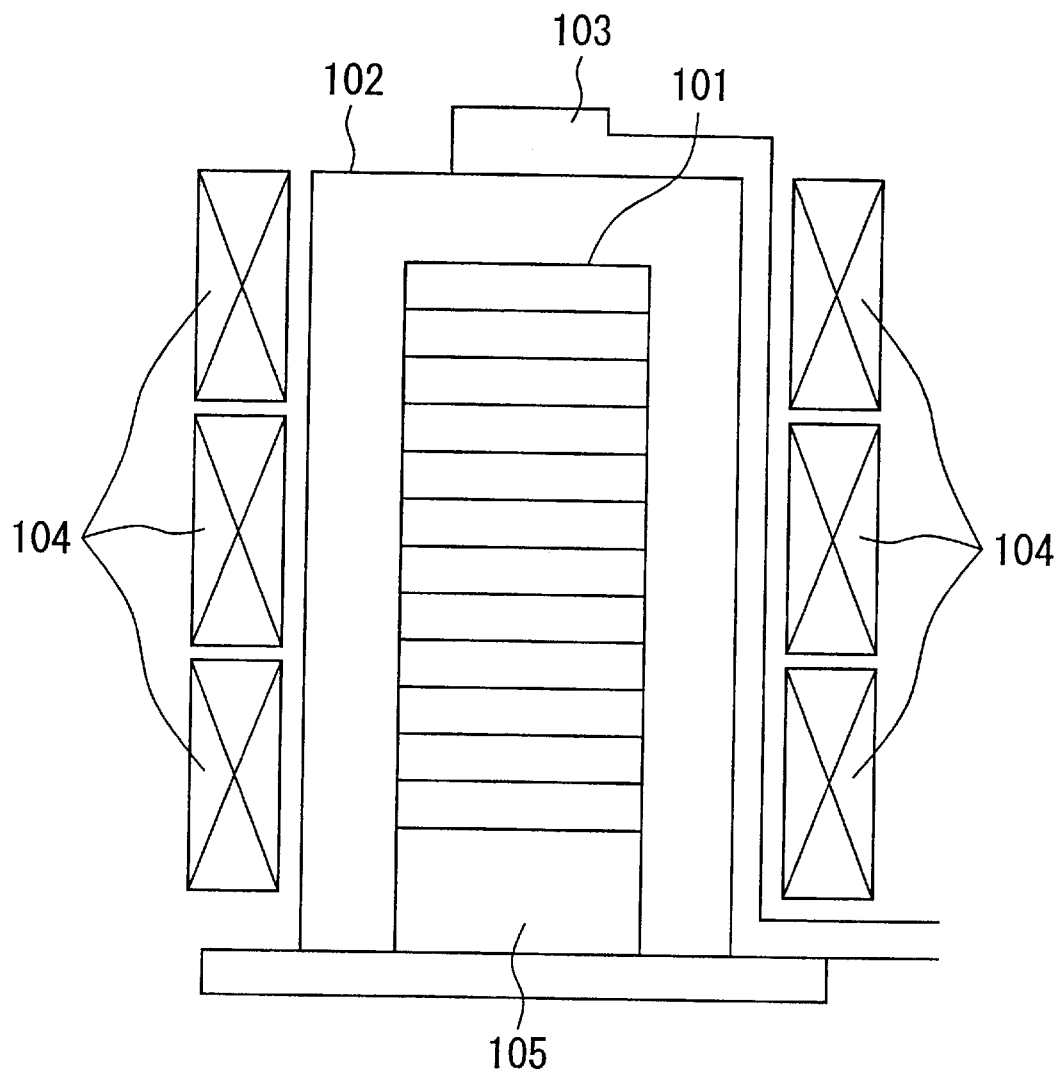
FIG. 6 is a cross sectional view illustrating a schematic structure of a vertical heat treatment apparatus as a first prior art example.
Figure 7:
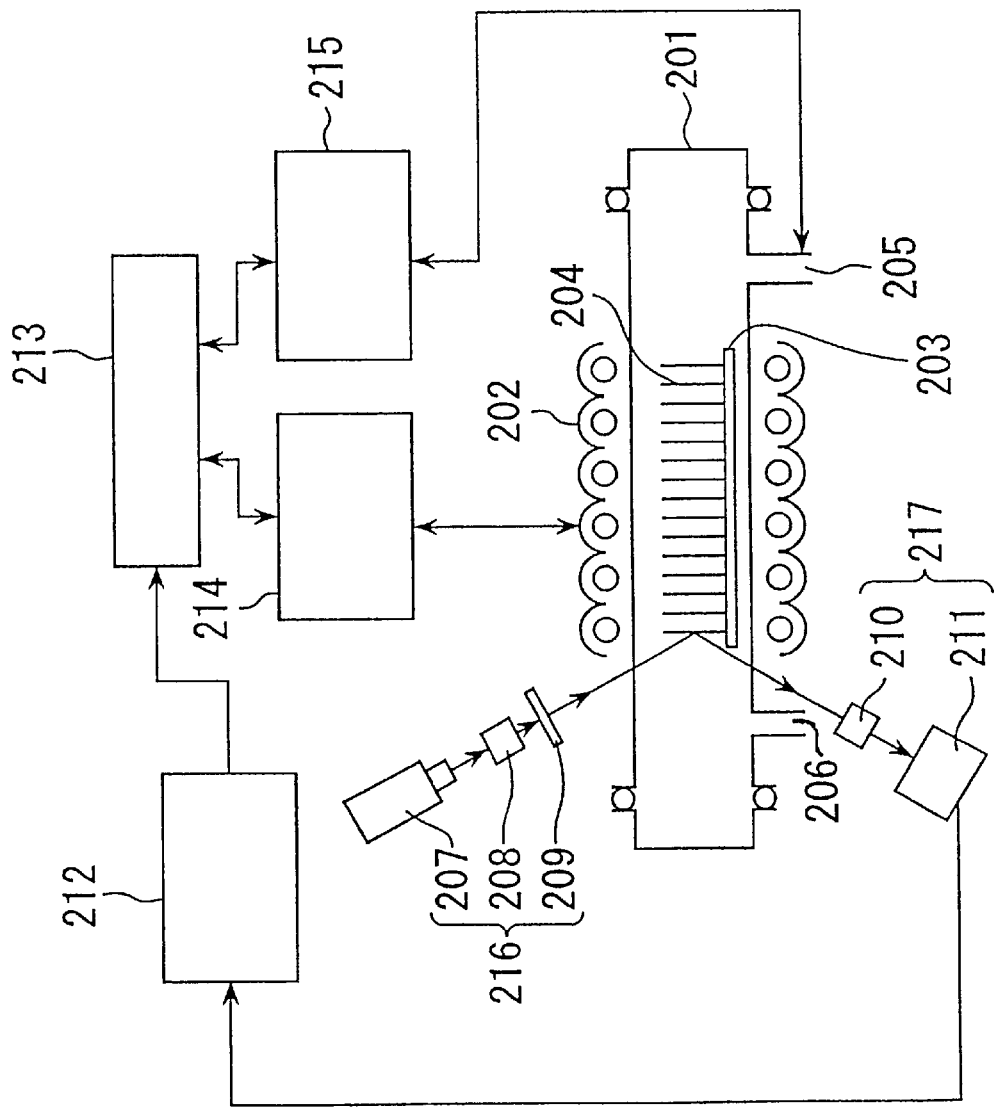
FIG. 7 is a block diagram illustrating a schematic structure of a lateral heat treatment apparatus including a control portion as a second prior art example.
Figure 8A:
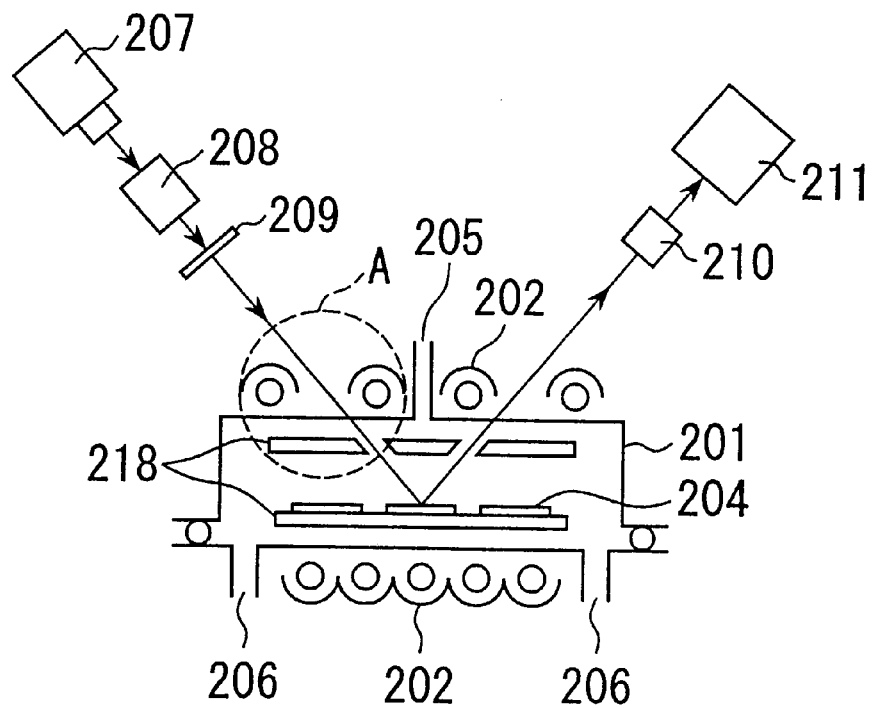
FIG. 8A is a block diagram illustrating a schematic structure of a lateral heat treatment apparatus as a third prior art example.
Figure 8B:
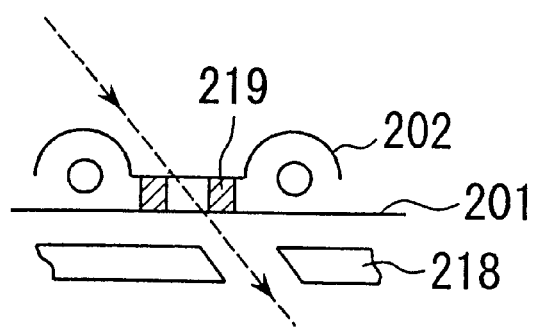
FIG. 8B is a partial cross sectional view illustrating a schematic structure of a portion A of FIG. 8A.

Now, description will be made on an operation of the vertical heat treatment apparatus according to this embodiment, with reference to the drawings including FIG. 5. FIG. 5 is a schematic block diagram showing an overall structure of the vertical heat treatment apparatus according to this embodiment, including a control system portion.

As shown in FIG. 5, the vertical heat treatment apparatus of this embodiment comprises, as the control system portion, detection units 13a through 13c, data processing portions 14a through 14c, a central control portion 10, temperature control portions 11a through 11c, and a gas flow rate control portion 12.

In operation, the inside of the reaction tube 2 is previously heated to a high temperature of approximately 800 through 1000 degrees Celsius, by using the heaters 4a through 4c disposed at the upper portion, the middle portion and the lower portion of the periphery of the reaction tube 2. Then, 100 through 200 sheets of semiconductor wafers 1 are loaded onto the quartz boat 5 as a batch, and the quartz boat 5 loaded with the semiconductor wafers 1 is inserted into the reaction tube 2. Since the reaction tube 2 leans from the vertical direction toward the horizontal direction by approximately 30 through 70 degrees, the semiconductor wafers 1 loaded onto the quartz boat 5 are mutually shifted in the horizontal direction. Therefore, at each end portion of the upper surfaces of the semiconductor wafers 1, a shifted portion 8 is produced which is a non-overlapped portion between adjacent upper and lower wafers and which has a width 8b of approximately 3 through 15 mm.

Next, a gas such as oxygen, steam, water vapor and the like is introduced at a predetermined flow rate into the reaction tube 2 from the gas supply tube 3. Thereby, the gas introduced and the surface portion of each of the semiconductor wafers 1 chemically react with each other, and an oxide film is formed on the surface of each of the semiconductor wafers 1. In this case, a laser light, 21a is irradiated onto the shifted portion 8 of the upper surface of the semiconductor wafer 1a, which is disposed in the upper portion of the reaction tube 2, that is, which is loaded onto the upper portion of the quartz boat 5, from the optical fiber 6a for irradiation, and a laser light 22a reflected from the shifted portion 8 is received by the optical fiber 7a for reception. Similarly, a laser light, 21b is irradiated onto the shifted portion 8 of the upper surface of the semiconductor wafer 1b, which is disposed in the middle portion of the reaction tube 2, that is, which is loaded onto the middle portion of the quartz boat 5, from the optical fiber 6b for irradiation, and a laser light 22b reflected from the shifted portion 8 is received by the optical fiber 7b for reception. Further, a laser light 21c is irradiated onto the shifted portion 8 of the upper surface of the semiconductor wafer 1c, which is disposed in the lower portion of the reaction tube 2, that is, which is loaded onto the lower portion of the quartz boat 5, from the optical fiber 6c for irradiation, and a laser light, 22c reflected from the shifted portion 8 is received by the optical fiber 7c for reception.

The laser light 22a–22c reflected from the respective shifted portions 8 and received by the optical fiber 7a through 7c for reception is transmitted to the detection units 13a through 13c and is converted into electrical signals. The electrical signals obtained in the detection units 13a through 13c are delivered to the data processing portions 14a through 14c, respectively. The data processing portions 14a through 14c respectively calculate thickness of the oxide films formed on the semiconductor wafers la through lc on which the laser light is irradiated. Data of thickness of the oxide films calculated by the respective data processing portions 14a through 14c is delivered to the central processing portion 10.

The central processing portion 10 controls the temperature control portions lha through 11c based on the data of thickness of the oxide films formed on the semiconductor wafers la through lc transmitted from the data processing portions 14a through 14c, and thus controls the heating temperature by the heaters 4a through 4c disposed at the upper portion, the middle portion and the lower portion of the periphery of the reaction tube 2. Thereby, the temperature of the upper portion, the middle portion and the lower portion inside the reaction tube 2 is controlled. Further, the central control portion 10 controls the gas flow rate control portion 12 based on the data of thickness of the oxide film formed on the semiconductor wafers 1a through 1c sent from the data processing portionsl4a through 14c, and thereby controls the flow rate of the gas introduced into the reaction chamber 2 from the gas supply tube 3.

As an example of a practical method of controlling the thickness of the oxide films, when the thickness of all the oxide films formed on the semiconductor wafers 1a through 1c reaches a desired thickness, the central control portion 10 controls the gas flow rate control portion 12 to stop a supply of 5 the gas into the reaction tube 2 from the gas supply tube 3 such that the oxide film is not formed any more on all the semiconductor wafers. Thereby, the oxide films are not formed on all the semiconductor wafers in the reaction tube 2.

Also, for example, when it is detected that the thickness of the oxide film formed on the semiconductor wafer 1c is thinner than the thickness of each of the oxide films formed on the semiconductor wafers 1a and 1b, the central control portion 10 controls the temperature control portions 11a through 11c to make the heating temperature by the heater 4c higher than the heating temperatures by the heaters 4a and 4b, or to raise only the heating temperature by the heater 4c from the present heating temperature. Such control is performed, for example, by making electric power supplied to the heater 4c larger than electric power supplied to each of the heaters 4a and 4b, or by increasing electric power supplied to the heater 4c from the present value. By such temperature control, since a temperature of the lower portion inside the reaction tube 2 rises, the rate of forming the oxide films on the semiconductor wafers disposed at the lower portion inside the reaction tube 2 becomes faster than the rate of forming the oxide films on the semiconductor wafers disposed at the middle portion and the upper portion inside the reaction tube 2. Thereby, it becomes possible to make the thickness of the oxide films formed on the semiconductor wafers disposed at the lower portion inside the reaction tube 2 equal to the thickness of the oxide films formed on the semiconductor wafers disposed at the middle portion and the upper portion inside the reaction tube 2. After the thickness of the oxide film on the semiconductor wafer lc becomes equal to the thickness of the oxide films on the semiconductor wafers 1a and 1b, the central control portion 10 can control the temperature control portions lha through 11c to make the heating temperature of the heater 4c equal to the heating temperature of the heaters 4a and 4b.

In the above-mentioned embodiment, three pairs of optical fibers for irradiating laser light and optical fibers for receiving laser light are disposed at three locations, i.e., the upper portion, the middle portion and the lower portion inside the reaction tube, and film thickness of three semiconductor wafers among a batch, for example, 100 through 200 sheets, of semiconductor wafers is measured. However, the present invention is not limited to such constitution. For example, the number of pairs of the optical fibers for irradiating laser light and the optical fibers for receiving laser light can be two. Also, for example, the number of pairs of the optical fibers for irradiating laser light and the optical fibers for receiving laser light can be more than three. In such case, the thickness of the films formed on the semiconductor wafers of one batch can be estimated and controlled more precisely and appropriately. Also, according to the increase in the number of the pairs of the optical fibers, it is preferable to increase the number of the heaters for heating portions inside the reaction tube and the temperature control portions for controlling heating temperature of the heaters. Thereby, it is possible to control the temperature of the portions inside the reaction tube independently for respective areas. As a result, it becomes possible to more strictly control the thickness of the films formed on the semiconductor wafers.

Also, in the above-mentioned embodiment, the optical fibers for irradiating laser light and the optical fibers for receiving laser light are fixed to the reaction tube 2. However, it is also possible to fix these optical fibers to the quartz boat 5 for loading the semiconductor wafers. In this case, when the quartz boat 5 is inserted into the reaction tube 2, the optical fibers for irradiating laser light and the optical fibers for receiving laser light are also inserted into the reaction tube 2 and disposed inside the reaction tube 2.

As mentioned above, according to the vertical heat treatment apparatus of the present invention, measurement means for detecting film thickness are disposed at a plurality of locations inside the reaction tube. The film thickness of the oxide films formed on the surfaces of a plurality of semiconductor wafers within a batch of the semiconductor wafers can be measured regularly or continuously, for example, at a regular interval, and the thickness of the oxide films can be precisely controlled by feeding back the measured result of the film thickness to the temperature control porions and the gas flow control portion. Thereby, it becomes possible to improve uniformity of the oxide films formed on the respective semiconductor wafers of a batch. As a result, it is not necessary to perform heat treatment of the semiconductor wafers again and, therefore, it is possible to avoid increase in time loss and cost in the manufacturing process. Also, it becomes possible to improve manufacturing yield of a semiconductor device.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A vertical heat treatment apparatus comprising:
   a reaction tube which inclines from the vertical direction toward the horizontal direction by a predetermined angle; and
   a wafer supporting means which supports a plurality of semiconductor wafers inside said reaction tube such that said wafers are disposed parallel to each other while keeping a gap between adjacent upper and lower wafers and having an offset portion between adjacent upper and lower wafers;
   wherein said plurality of semiconductor wafers disposed inside said reaction tube are heated and a predetermined gas is introduced into said reaction tube, thereby forming oxide films on said plurality of semiconductor wafers.

2. A vertical heat treatment apparatus as set forth in claim 1, further comprising a plurality of film thickness detecting means, each of said plurality of film thickness detecting means detects the thickness of said oxide film formed on said offset portion of mutually different one of said plurality of semiconductor wafers disposed in said reaction tube.

3. A vertical heat treatment apparatus as set forth in claim 2, wherein each of said plurality of film thickness detecting means comprises a first optical fiber and a second optical fiber, said first optical fiber irradiates a laser light onto said offset portion of said semiconductor wafer to detect thickness of an oxide film formed on said semiconductor wafer, and said second optical fiber receives a laser light irradiated from said first optical fiber and reflected by said offset portion of said semiconductor wafer.

4. A vertical heat treatment apparatus as set forth in claim 2, wherein said reaction tube inclines from the vertical direction toward the horizontal direction by an angle of 30 through 70 degrees.

5. A vertical heat treatment apparatus as set forth in claim 2, wherein said offset portion of each of said semiconductor wafers has a width of approximately 3 through 15 mm.

6. A vertical heat treatment apparatus as set forth in claim 2, wherein said supporting means is made of quartz.

7. A vertical heat treatment apparatus as set forth in claim 2, wherein at least a part of each of said plurality of film thickness detecting means is disposed at said supporting means.

8. A vertical heat treatment apparatus as set forth in claim 1, further comprising:
   at least one heating means for heating said plurality of semiconductor wafers disposed inside said reaction tube; and
   a control means which controls heating temperature of said at least one heating means and a flow rate of said predetermined gas introduced into said reaction tube.

9. A vertical heat treatment apparatus as set forth in claim 8, wherein a plurality of said heating means are provided.

10. A vertical heat treatment apparatus as set forth in claim 8. wherein the number of said heating means corresponds to the number of said film thickness detecting means.

11. A vertical heat treatment apparatus as set forth in claim 10, wherein each of said heating means is disposed at a location corresponding to a location of each of said plurality of film thickness detecting means.

12. A vertical heat treatment apparatus as set forth in claim 11, wherein said control means controls the heating temperature of each of said heating means independently, based on the thickness of said oxide film detected by a corresponding one of said plurality of film thickness detecting means.

\* \* \* \* \*

UNITED STATES PATENT AND TRADEMARK OFFICE
CERTIFICATE OF CORRECTION

PATENT NO. : 6,241,822 B1  
DATED : June 5, 2001  
INVENTOR(S) : Ide

Page 1 of 1

It is certified that error appears in the above-identified patent and that said Letters Patent is hereby corrected as shown below:

Column 12,  
Line 31, "Avertical" should be -- A vertical --  
Line 47, "Avertical" should be -- A vertical --  
Line 48, "8." should be -- 8, --  
Line 50, "Avertical" should be -- A vertical --

Signed and Sealed this

Twenty-third Day of April, 2002

Attest:

Attesting Officer

JAMES E. ROGAN  
Director of the United States Patent and Trademark Office